United States Patent [19]

Komatsu

[11] Patent Number: 4,882,290

[45] Date of Patent: Nov. 21, 1989

[54] SEMICONDUCTOR DEVICE AND A METHOD OF MANUFACTURING THE SAME

[75] Inventor: Shigeru Komatsu, Kitakyushu, Japan

[73] Assignee: Kabushiki Kaisha Toshiba, Kawasaki, Japan

[21] Appl. No.: 148,351

[22] Filed: Jan. 25, 1988

[30] Foreign Application Priority Data

Jan. 26, 1987 [JP] Japan .................................. 62-14152

[51] Int. Cl.⁴ .................. H01L 21/265; H01L 21/225
[52] U.S. Cl. ......................................... 437/31; 437/33;
437/162; 437/186; 437/153; 148/DIG. 10;
148/DIG. 11; 148/DIG. 123; 148/DIG. 124;
357/34; 357/59
[58] Field of Search ...................... 437/28, 31, 32, 33,
437/160, 162, 203, 186, 233, 150, 151, 152, 153,
154; 357/59 H, 34, 43, 35, 91; 148/DIG. 9,
DIG. 10, DIG. 123, DIG. 124, DIG. 11, DIG.
30, DIG. 82, DIG. 83, DIG. 78

[56] References Cited

U.S. PATENT DOCUMENTS

| | | | |
|---|---|---|---|
| 3,717,507 | 2/1973 | Abe | 437/31 |
| 3,997,367 | 12/1976 | Yau | 437/31 |
| 4,157,269 | 6/1979 | Ning et al. | 437/33 |
| 4,368,573 | 1/1983 | deBrebisson et al. | 437/28 |
| 4,398,962 | 8/1983 | Kanazawa | 437/28 |
| 4,407,060 | 10/1983 | Sakurai | 357/59 H |
| 4,431,460 | 2/1984 | Barson et al. | 357/59 H |
| 4,484,211 | 11/1984 | Takemoto et al. | 357/59 H |
| 4,495,010 | 1/1985 | Kranzer | 357/59 H |
| 4,735,912 | 4/1988 | Kawakatsu | 437/162 |

FOREIGN PATENT DOCUMENTS

60-72268 4/1960 Japan .
60-81862 5/1960 Japan .

*Primary Examiner*—Brian E. Hearn
*Assistant Examiner*—Mary Wilczewski
*Attorney, Agent, or Firm*—Finnegan, Henderson, Farabow, Garrett and Dunner

[57] ABSTRACT

In an NPN transistor, a contact base region, an active base region, and a further base region are formed in the silicon substrate. The further base region is between the contact base region and the active base region, and is adjacent to the contact base region and the active base region. The further base region has a depth shallower than that of the contact base region and deeper than that of the active base region. In the method of forming the bipolar transistor, a polysilicon semiconductor layer is formed on a semiconductor substrate. The polysilicon semiconductor layer is partially etched to form a base leading electrode and an emitter leading electrode. A semiconductor impurity is implanted into a base forming region of the silicon substrate via that portion where the polysilicon semiconductor layer is removed.

1 Claim, 9 Drawing Sheets

SEMICONDUCTOR DEVICE AND A METHOD OF MANUFACTURING THE SAME

BACKGROUND OF THE INVENTION

This invention relates to a semiconductor device and a method of manufacturing the same, and more particularly, to the improvements of the base and emitter regions, the base leading electrode and the emitter leading electrode of a high speed, and high frequency bipolar transistor.

The recent intensive efforts to improve the performances of the bipolar transistor operating at high frequency or at high speed are found in the microfabrication technique and the self-aligning technique, which are both for reducing the parasitic capacitance possibly existing between the emitter and base, and between the base and collector, and for reducing the base resistance. In recent transistors, a polysilicon layer is used to form the base leading electrode and the emitter leading electrode, and an emitter region diffusing source. Those recent transistors are, for example, SST (super self-aligned process technology) transistors, self-aligned transistors fabricated by using RIE (reactive ion etching) technique, PSA (polysilicon self-aligned) transistors, APSA (advanced PSA) transistors, BEST (base emitter self-aligned technology) transistors, and SICOS (sidewall base contact structure) transistors. The SST transistor is fabricated through a sequence of process steps shown in FIGS. 1A to 1D. In the figure, reference symbols 101a to 101c designate $SiO_2$ layers; 102a and 102b $SiO_2$ layers; 103B a polysilicon layer doped with boron; 103As a polysilicon layer doped with arsenic; 104E an emitter electrode; 104B a base electrode; 104C a collector electrode. A base leading electrode is formed by polysilicon layer 103B. An emitter leading electrode is formed by polysilicon layer 103As. Polysilicon layer 103As is also used as an impurity diffusing source to form emitter region 105E. Reference symbol 105B represents a base region and 105C a collector region.

Figure 1A:
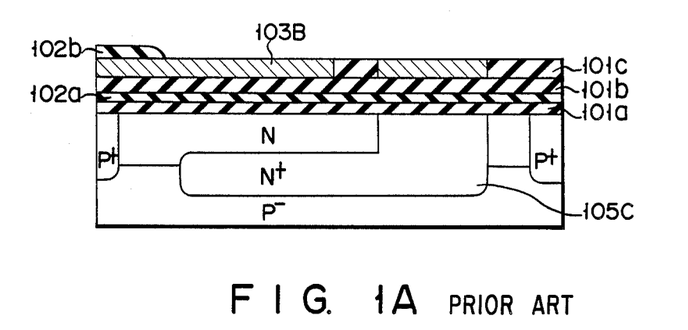
FIGS. 1A to 1D show a sequence of process steps to manufacturing SST transistors.
Figure 1B:
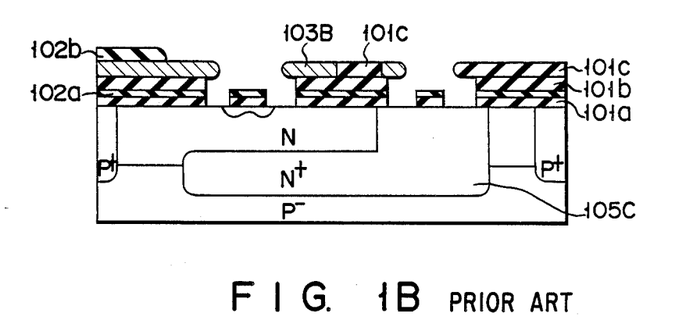
Figure 1C:
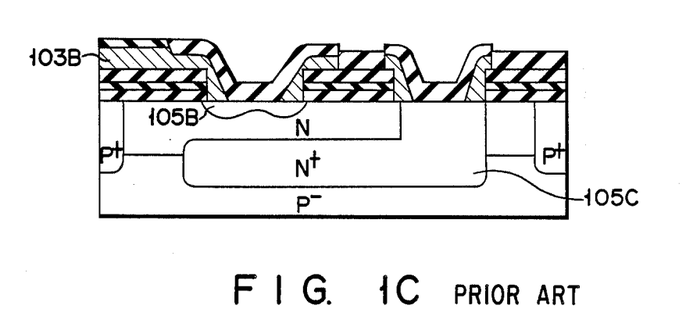
Figure 1D:
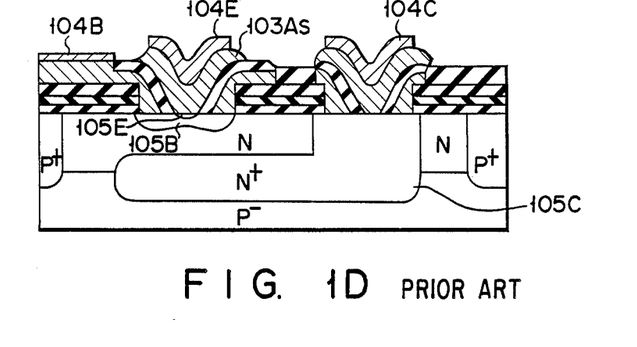
Figure 2A:
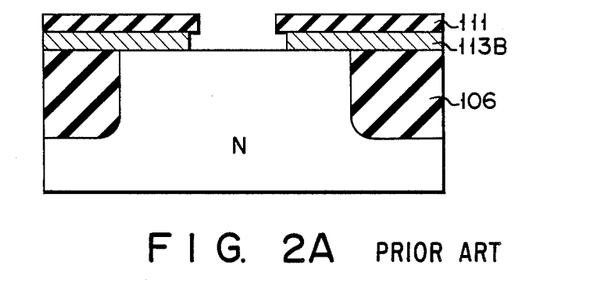
FIGS. 2A and 2B show process steps to manufacture self-align transistors using RIE process.
Figure 2B:
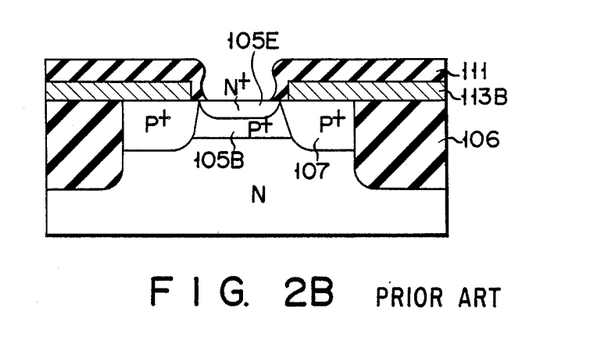

The self-aligned transistor, which is manufactured using the RIE technique, is manufactured through the process steps shown in FIGS. 2A and 2B. In the figures, reference symbols 113B is indicative of a polysilicon layer doped with boron, and reference numeral 111 designates a $SiO_2$ layer formed by the CVD (chemical vapor deposition) process. A mask with a predetermined pattern (not shown) made of photo resist is formed on the CVD $SiO_2$ layer 111. $SiO_2$ layer 111 and polysilicon layer 113B are partially etched away by RIE process to form a hole which communicates with the region of the substrate where the emitter is to be formed. Then, the side portion of polysilicon layer 113B is etched by an etching solution of $HF:HNO_3:CH_3COOH=1:3:8$. Following the etching, the surface layer of the structure is oxidized and $SiO_2$ layer 111 is partially etched away by RIE process to form a hole which communicates with the emitter forming region. Reference symbol 106 denotes an $SiO_2$ layer, and reference symbol 107 denotes a base region.

Figure 3:
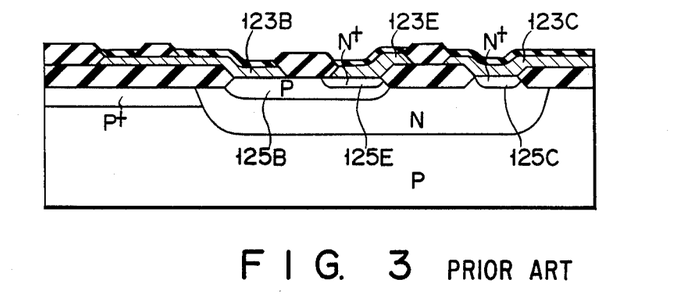
FIG. 3 is a sectional view showing a PSA transistor.

In FIG. 3 showing a PSA transistor as an example of the self-aligned transistor with a polysilicon layer, polysilicon layer 123B forms a base region leading electrode. Polysilicon layer 123E forms an emitter region leading electrode, and polysilicon layer 123C forms a collector region leading electrode. Polysilicon layers 123E and 123C are also used as diffusing sources for forming emitter region 125E and collector region 125C by doping the emitter and collector regions with impurity. In other words, emitter region 125E and collector region 125C are formed by the self-align method, using the polysilicon layers 125E and 125C to reduce the transistor area. Reference symbols 125B, 125E, and 125C denote a base region leading electrode, an emitter region leading electrode, and a collector region leading electrode, respectively.

Figure 4:
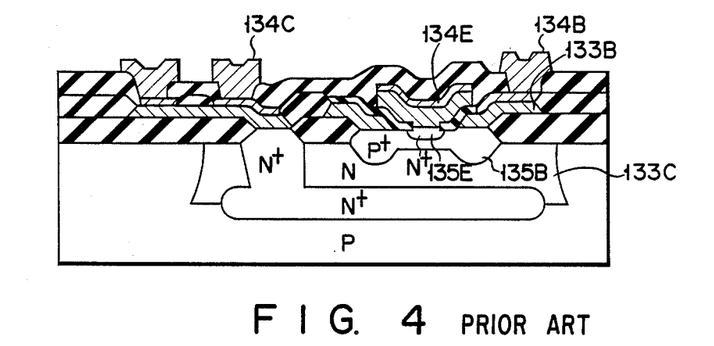
FIG. 4 is a sectional view showing an APSA transistor.

An APSA transistor, which is the PSA transistor improved to operate at a high speed, is shown in FIG. 4. As shown, as in the case of the PSA transistor, the base leading electrode made of polysilicon layer 133B is extended from that portion 135B of the P base region, which is around emitter region 135E (as viewed from the top or bottom in the drawing). An emitter contact opening and a base contact opening are formed by using a mask (not shown). Reference symbols 134E, 134B and 134C are representative of emitter, base, and collector electrode layers, respectively.

Figure 5A:
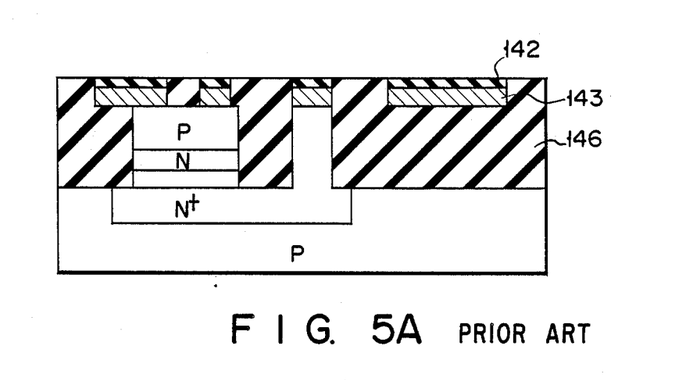
FIGS. 5A and 5B show sequential process steps to manufacture BEST transistors.
Figure 5B:
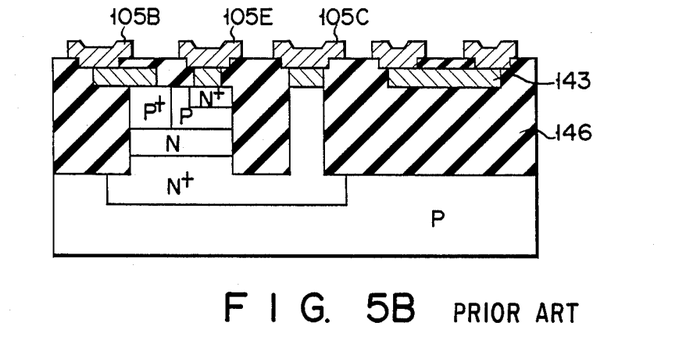

The BEST transistor is formed through a manufacturing process shown in FIGS. 5A and 5B. In the process, when the surface region of polysilicon layer 143 formed on oxide layer 146 for separating individual elements is oxidized by using $Si_3N_4$ layer 142, the positions of the emitter contact opening and the base contact opening are defined. Reference symbols 105B, 105E, and 105C denote a base electrode, an emitter electrode, and a collector electrode, respectively.

Figure 6A:
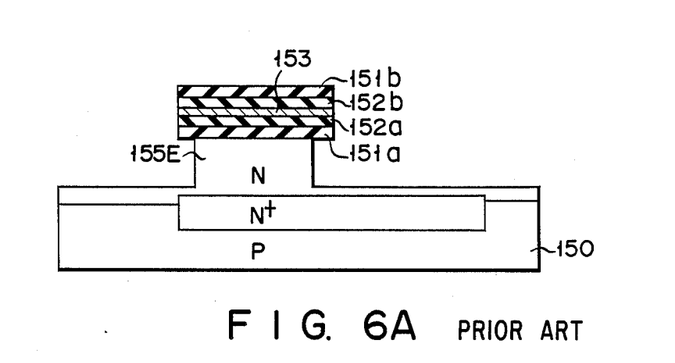
FIGS. 6A to 6D show sequential process steps to manufacture SICOS transistors.
Figure 6B:
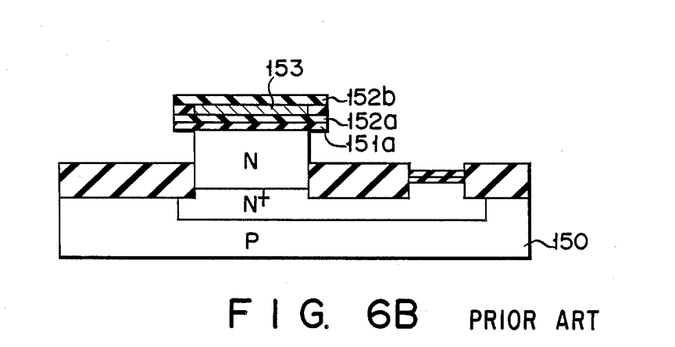
Figure 6C:
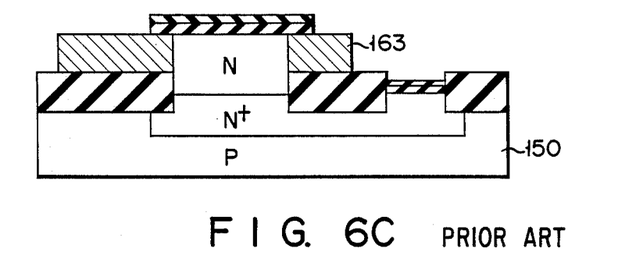
Figure 6D:
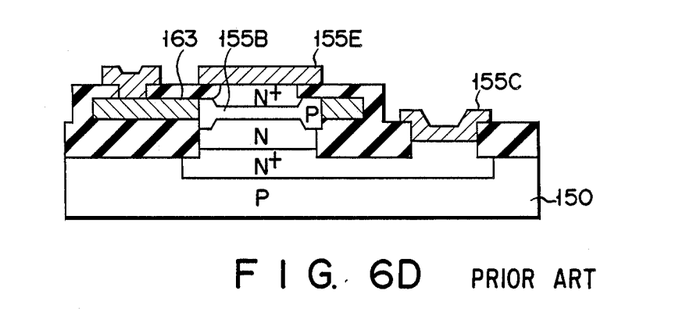

In the SICOS transistor, the base leading electrode of the polysilicon extends from the side wall of the base region 155B, as shown in FIGS. 6A to 6D. In the manufacture thereof, an epitaxial growth layer is formed on silicon substrate 150. Further layered on the epitaxial growth layer are first $SiO_2$ layer 151a, first $Si_3N_4$ layer 152a, boron doped polysilicon layer 153, second $Si_3N_4$ layer 152b, and second $SiO_2$ layer 151b. The multilayer is dry-etched, except the portion where emitter region 155E is to be formed. The epitaxial growth layer and the multilayer are further subjected to the etching to remove the side portion thereof (FIG. 6A). Then the structure is oxidized to form a $Si_3N_4$ layer (not shown) on the surface region of the structure. Thereafter, the structure is subjected to the dry etching process to remove that portion of the $Si_3N_4$ layer which is on the epitaxial layer. Further, it is subjected to the selective oxidation to form a thick $SiO_2$ layer on the epitaxial layer. Succeedingly, that portion of the $Si_3N_4$ layer which is on the side wall of the multilayer is removed. Thereafter, impurity doped polysilicon layer 163 is formed over the entire surface of the structure, and is patterned to form base leading electrode. Reference symbols 155E and 155C denote an emitter electrode, and a collector electrode, respectively.

Figure 7:
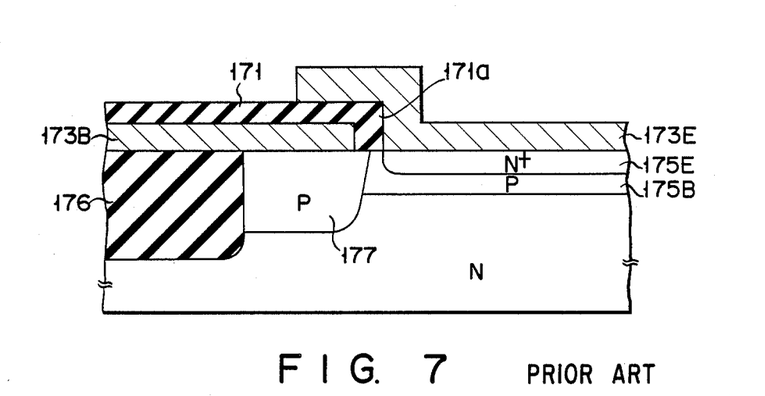
FIG. 7 shows the side wall of a prior art transistor.

As described above, transistors other than the PSA and APSA transistors are manufactured using the RIE technique, which is complicated and instable. This indicates a low yield of these transistors. In the case of the SST transistor, since the self-align process is frequently used, the number of masks used in the process from the formation of base region 105B to the formation of emitter region 105E is very small, only 2, when comparing with that (4 to 5) of the general bipolar transistor. In this respect, the number of formations of the resist pattern is reduced to improve the cost performance. However, the self-align technique involves one problem to be solved. In FIG. 7, this problem resides in the formation of base leading electrode 173B and emitter region 175E, and in the formation of insulating layer 171 for insulating emitter leading electrode 173E from base leading electrode 173B. The formation of this insulating layer 171 is very complicated in such a way that base leading electrode 173B is partially oxidized or a CVD-SiO$_2$ layer is formed, and it is processed by the RIE technique to remain that portion 171a thereof which is on the side wall of base leading electrode 173B.

In FIG. 7, reference symbol 175E designates an emitter region, and 175B and 177 base regions, and 176 an SiO$_2$ layer.

As described above, the prior art semiconductor device and its manufacturing method can provide almost satisfactory electrical characteristics, but need many masks in its manufacturing. Use of many masks makes the manufacturing process complicated and the resultant products more expensive.

SUMMARY OF THE INVENTION

This invention relates to a semiconductor device and a method of manufacturing the same which successfully solve the above-mentioned problems of the prior arts.

According to the present invention, there is provided a semiconductor device of a bipolar type comprising a conduct base region formed in a semiconductor substrate, a base leading electrode formed on said contact base region, an active base region formed in said semiconductor substrate, on which an emitter region is formed, a base region formed in said semiconductor substrate, said last-recited base region being between said contact base region and said active base region, and being adjacent to said contact base region and said active base region, said last-recited base region having a depth shallower than that of said contact base region and deeper than that of said active base region.

According to the present invention, there is further provided a semiconductor device comprising a semiconductor region of a first conductivity type which is formed in a semiconductor substrate of the first conductivity type, an insulating layer formed in said semiconductor substrate for separating said semiconductor region from other semiconductor regions, an emitter region of the first conductivity type formed in said semiconductor region by an impurity diffusion process, a semiconductor layer containing a semiconductor impurity formed on said semiconductor region and extending on said insulating layer, said semiconductor layer forming a base leading electrode, a first region of a second conductivity type serving as a part of a base region, said first region being formed in that portion of said semiconductor region, on which said semiconductor layer extends, said first region being formed by diffusing an impurity from said semiconductor layer into said semiconductor region and being in contact with said insulating layer, a second region of the second conductivity type serving as a part of said base region, said second region being formed in that portion of said semiconductor region, above which said semiconductor layer is not formed, said second region having a depth shallower than that of said first region and being in contact with said first region, a third region of the second conductivity type serving as an active base region, said third region being formed in that portion of said semiconductor region, above which said emitter region is formed, said third region having a depth shallower than that of said second region and being in contact with said second region, and an emitter leading electrode formed on said emitter region, said emitter leading electrode being formed of a semiconductor layer containing a semiconductor impurity.

According to the present invention, there is still further provided a method of manufacturing a semiconductor device comprising the steps of forming an insulating layer in a semiconductor substrate, for defining a semiconductor region of a first conductivity type separated from other semiconductor regions, forming a first polysilicon semiconductor layer containing a second conductivity type impurity constituting an emitter leading electrode, on an emitter forming region of the first conductivity type in said semiconductor region, and at a same time forming a second polysilicon semiconductor layer constituting a base leading electrode, on said insulating layer and that portion of said semiconductor region which is apart from said emitter forming region, implanting a second conductivity type impurity ion into portion of said second polysilicon semiconductor layer on said insulating layer and a portion of said second polysilicon semiconductor layer on said semiconductor region, said portions of said second polysilicon semiconductor layer being continuous to each other, thermally heating the implanted ion to diffuse the ion into said semiconductor region to form a first region of the second conductivity type, implanting a second conductivity type impurity ion into that portion of said semiconductor region on which said first and second semiconductor layers are not formed, thermally heating the last-recited ion to form a second region of the second conductivity type, which is in contact with and shallower than said first region of the second conductivity type, and at a same time to diffuse the second conductivity type impurity from said first polysilicon semiconductor layer into said semiconductor region, so that a third region of the second conductivity type is formed in said semiconductor region, which is in contact with and shallower than said second region of the second conductivity type, and implanting a first conductivity type impurity ion into said second polysilicon semiconductor layer, and thermally heating the implanted ion to form a first conductivity type region constituting an emitter region in said third region of the second conductivity type.

According to the present invention, there is yet further provided a method of manufacturing a semiconductor device of a bipolar type comprising the steps of forming a polysilicon semiconductor layer on a semiconductor substrate, partially etching said polysilicon semiconductor layer to form a base leading electrode and an emitter leading electrode, and doping a semiconductor impurity into a base forming region of said semiconductor substrate via that portion where said polysilicon semiconductor layer is left.

In the present invention, the polysilicon layers for forming the base and emitter leading electrodes are formed in one step, while in the prior art these are formed in different steps. A portion of the polysilicon layer between the base and emitter is removed. An impurity for forming the base separation region is implanted via the removed portion to form an impurity doped region. The impurity doped region prevents the high concentration base contact region, which is in contact with the element separation layer, from contacting the high concentration emitter region of the conductivity, which is opposite to that of the high concentration base region. With this structure, the base region forming the impurity doped region can be formed between the high concentration base region and the active base region, so that a crystal defect, which will occur at the $p^-$-$N^-$ junction at shallow diffusion, can be prevented. Therefore, the resistance of the high concentration base region can be set at a desired value, not taking any care of the crystal defect.

BRIEF DESCRIPTION OF THE DRAWINGS

FIGS. 1 to 7 are sectional views showing the structures of conventional semiconductor devices, in which

DETAILED DESCRIPTION OF THE EMBODIMENT

A preferred embodiment of a semiconductor device according to the invention will be described by referring to the accompanying drawings.

Figure 8:
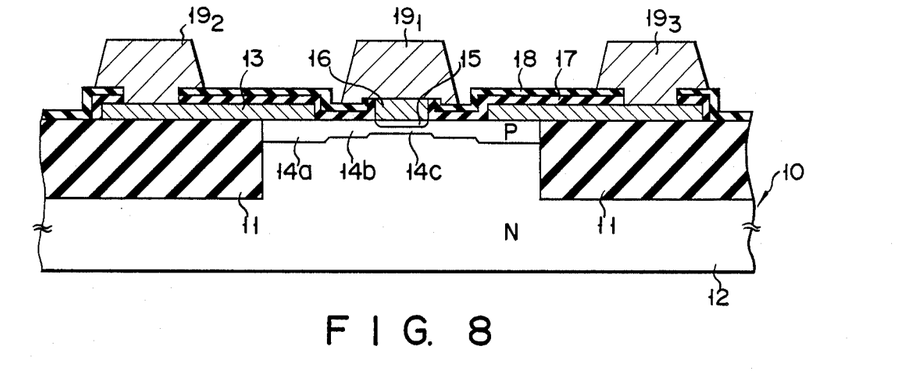
FIG. 8 is a sectional view of a semiconductor device according to an embodiment of this invention.

FIG. 8 shows in a cross sectional form a major part of a semiconductor device according to an embodiment of the present invention. The semiconductor device of this embodiment is a bipolar transistor, i.e., an NPN transistor.

$SiO_2$ region 11 forming an insulating layer for separating the regions where elements are to be formed, is formed in the surface region of a first major surface of semiconductor substrate 10. Semiconducotr layer 13 formed of, for example, a polysilicon layer, is formed on N type semiconductor region 12 (referred to as an N type region), which is separated from other elements formation regions (not shown) by $SiO_2$ region 11. Semiconductor layer 13 extends on insulating layer region 11. First P type region 14a is formed in the surface region of the N type region 12 right under polysilicon layer 13. First P type region 14a is formed by diffusing impurity from polysilicon layer 13. First P type region 14a contacts the insulating layer region, and is used as a base contact region which is a part of the base region. Second P type region 14b acting as a base separation region which is a part of the base region is formed in contact with P type region 14a and with no polysilicon right above the second P type region. Second P type region 14b is shallower than P type region 14a. Third P type region 14c exists as an active base region with N type emitter region 15 formed on the third P type region. Third P type region 14c is in contact with P type region 14b and is shallower than P type region 14b. Further formed on N type emitter region 15 is an emitter leading electrode 16 formed of an impurity doped polysilicon layer. A base leading electrode 13 formed of a polysilicon layer is formed on first P type region 14a and extends on insulating layer 11. In the figure, reference numeral 17 designates an $SiO_2$ layer, 18 is $Si_3N_4$ layer, and $19_1$, $19_2$, and $19_3$ electrodes formed by aluminum layers.

A method of manufacturing the semiconductor device shown in FIG. 8 will be described by referring to FIGS. 9A to 9J.

Figure 9A:
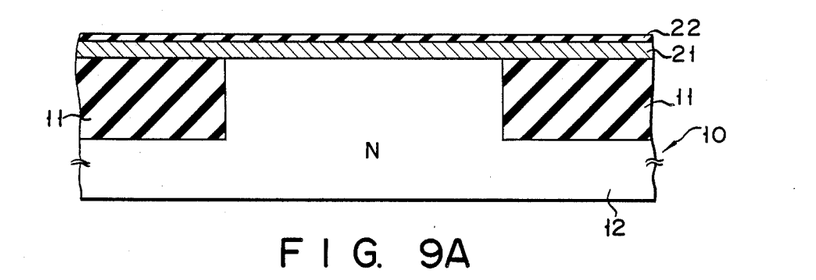
FIGS. 9A to 9J are sectional views showing a sequence of steps to manufacture the semiconductor device shown in FIG. 8.

PROCESS 1 (FIG. 9A)

$SiO_2$ region 11 of approximately 1 micrometers in thickness as an insulating layer is selectively formed in a major surface of N type silicon substrate 10. This $SiO_2$ region defines N type semiconductor region as an element forming region, which is separated from other element forming regions (not shown). Region 12 serves as a collector region. Polysilicon layer 21 containing no impurity is formed on the major surface of silicon substrate 10 by the LPCVD technique. $SiO_2$ layer 22 is formed on the polysilicon layer 21. The polysilicon layer is $3000 \pm 100$ Angstroms, for example, in thickness. $SiO_2$ layer 22 having the thickness of approximately $500 \pm 50$ Angstroms is formed on polysilicon layer 21. $SiO_2$ layer 22 ensures an intimate contact of a resist layer (not shown) with semiconductor substrate 10. The resist layer is formed in the subsequent photolithography etching process (PEP). In the process step where polysilicon layer 21 is selectively etched away to expose collector region 12, this $SiO_2$ layer prevents that portion of polysilicon layer 21 which is to be left from being etched.

Figure 9B:
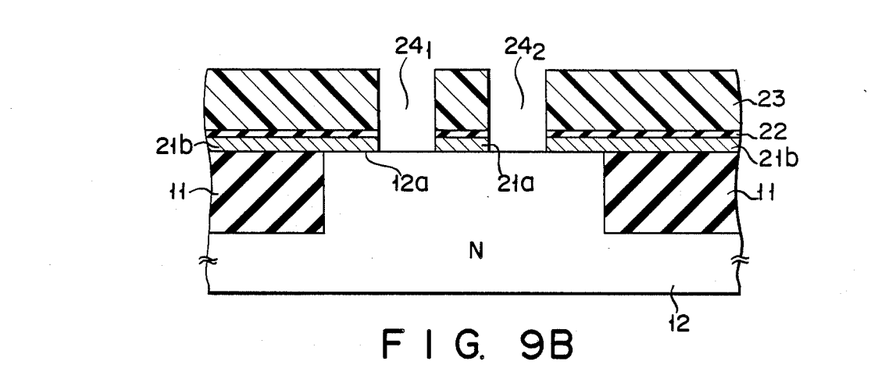

PROCESS 2 (FIG. 9B)

Photoresist layer 23 is formed on $SiO_2$ layer, and is patterned to form a predetermined pattern of resist layer. By using the resist layer 23 as a mask, the portion of $SiO_2$ layer 22 exposed to the openings of resist layer 23 is etched away, and then, the portion of polysilicon layer 21 under the exposed $SiO_2$ portion is etched away. Ammonium flouride $NH_4F$ may be used in this etching process. Alternatively, an anisotropically dry etching method or RIE (reactive ion etching) method in which a less amount of etching is performed in the lateral direction, may be used to remove the portions of layers 22 and 21 in a common step. In this case, the portion of $SiO_2$ layer 22 is completely removed, but the portion of polysilicon layer 21 is made to slightly remain on the surface region 12a of N type semiconductor region 12. Then, resist layer 23 is removed. Further, the remaining portion of polysilicon layer 21 is removed, using KOH as an etching solution. The process by the KOH solution also acts to remove the damaged layer caused on the surface region of N type semiconductor region 12 by the RIE process for the portions of layers 21 and 22. Polysilicon layer 21a on the emitter forming region formed through the above-mentioned processes, polysilicon layer 21b, and openings $24_1$ and $24_2$ formed by removing the layers therefrom, define an emitter region and forms a base-emitter separation region. Polysilicon layers 21a and 21b form an emitter electrode and a base leading electrode, respectively. Therefore, the pattern width of the resist layer on polysilicon layer 21a and the opening 24 of the resist layer are important factors to determine the performances of the transistor. In this embodiment, in order to secure at least 0.5 micrometers of overlapping of polysilicon layer 21b with N type region 12, the size of opening 24 is 1 micrometer in design value, taking the masking error and process accuracy into consideration. For this reason, the base region of the double base structure has 5 micrometers of design value.

Figure 9C:
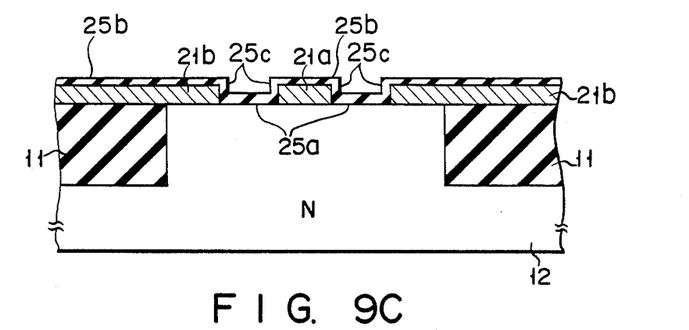

PROCESS 3 (FIG. 9C)

The structure is thermally heated in an acid atmosphere, so that SiO$_2$ layer 25a is formed on N type region 12, SiO$_2$ layer 25b on polysilicon layers 21a 21b, and SiO$_2$ layer 25c on the side walls of polysilicon layers 21a and 21b. In forming the SiO$_2$ layers, the condition is set such that SiO$_2$ layers 25a formed on silicon substrate 10 becomes 500±50 Angstroms. Under this condition, the thickness of SiO$_2$ layer 25c, which is formed on the side walls of polysilicon layers 21a and 21b, is nearly equal to that of SiO$_2$ layer 25a. The thickness of SiO$_2$ layer 25b is 700 Angstroms, because the thickness of SiO$_2$ layer 22 already formed on the polysilicon layers 21a and 21b is added to that of the layer 25b.

Figure 9D:
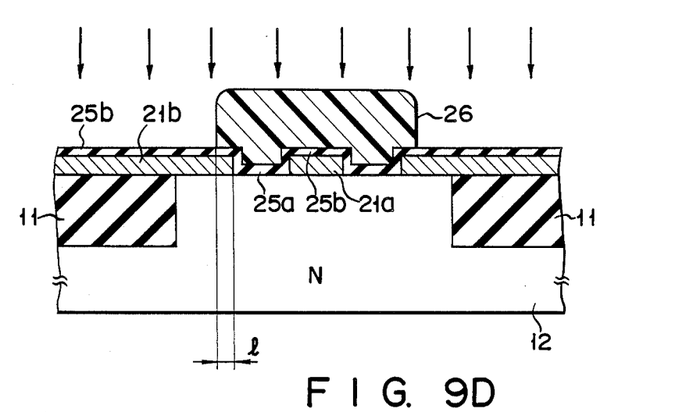

PROCESS 4 (FIG. 9D)

Resist layer 26 is formed on SiO$_2$ layer 25b formed on polysilicon layer 21a, SiO$_2$ layer 25a adjacent to SiO$_2$ layer 25b, and a part of SiO$_2$ layer 25b formed on polysilicon layer 21b. Resist layer 26 on SiO$_2$ layer 25b does not reach the boundary between N type region 12 and SiO$_2$ layer 11, giving that portion of N type region 12 which is not covered with resist layer 26. This region not covered with resist layer 26, in the next step, will be doped with boron. Using resist layer 26 as a mask, a boron ion is implanted into the portion of substrate 10 which is not covered with resist layer 26. In this case, it is required to prevent boron from being implanted into polysilicon layer 21a on the emitter forming region and the exposed portion of substrate 10 from which the polysilicon layer is removed (a portion corresponding to SiO$_2$ layer 25a). It is for this reason that resist layer 26 is extended on polysilicon layer 21 by a slight distance "l" beyond the junction of polysilicon layer 21b and SiO$_2$ layer 25a, allowing for a mask aligning error and a lateral spread of boron diffusion. The implantation of a boron ion is performed under the condition of, for example, 35 KeV of accelerating electric field and $2 \times 10^{15}$ to $5 \times 10^{15}$ atom/cm$^2$ of dosage. With the boron doped into polysilicon layer 21b, polysilicon layer 21b serves as a base leading electrode layer and as a diffusing source for forming p$^+$base contact region 14a. The doped boron decreases a resistance of polysilicon layer 21b.

Figure 9E:
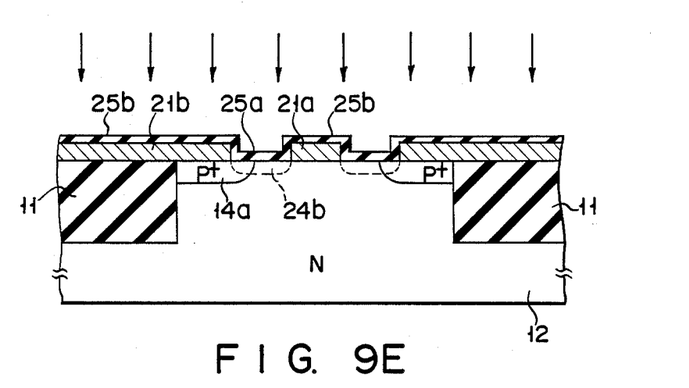

PROCESS 5 (FIG. 9E)

The structure is subjected to the thermal treatment at 900° to 1000° C., so that the doped boron is activated to form first P type region 14a adjacent to SiO$^2$ region 11. Thereafter, resist layer 26 is removed. Subsequently, the implantation of a boron ion is performed under the condition of 30 KeV of accelerating electric field and $1 \times 10^{14}$ to $3 \times 10^{14}$ atom/cm$^2$ of dosage, so that a boron ion is implanted into polysilicon layers 21a and 21b, and also implanted via SiO$_2$ layer 25a into the silicon substrate to form boron doped region 24b in the substrate.

Figure 9F:
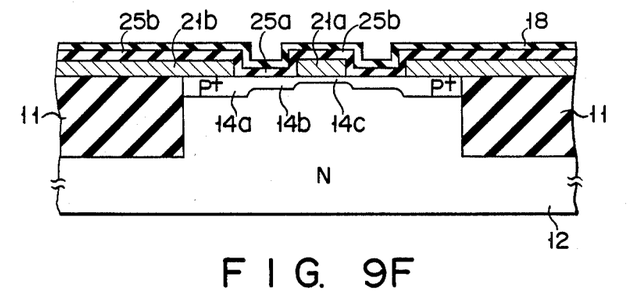

PROCESS 6 (FIG 9F)

A thermal treatment is applied to the structure to activate the implanted boron to form second P type region 14b, i.e., P base region 14, adjacent to first P type region 14a. With the activation, the boron implanted in the polysilicon layer 21a in the emitter forming region is diffused into N type silicon region 12 to form third P type region 14c acting as a p$^-$ active base region. In the subsequent step, Si$_3$N$_4$ layer 18 acting as a passivation layer of 500 to 1000 Angstroms is formed on the surface of the structure.

From the foregoing, it can be seen that the base structure, which needs a very complicated fabricating method in the prior art, can be simply formed if the process steps shown in FIGS. 9A to 9F according to this embodiment are used.

Figure 9G:
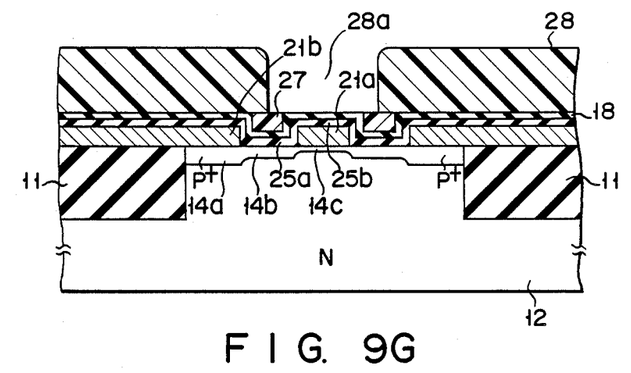

PROCESS 7 (FIG. 9G)

A resist layer (not shown) is formed on the surface of the structure. The resist layer is partially removed by RIE process, with that portion 27 of the resist layer 27 left in the trench defined by SiO$_2$ layers 25a, 25b and 25c. It is not necessary to completely remove that portion of the resist layer which is above the polysilicon layer by this RIE etching process. Then, resist layer 28, which can patterned independently of the patterning of resist layer 27, is formed on the surface of the structure. Following this, resist layer 28 is patterned to form opening 28a on the emitter forming region.

Figure 9H:
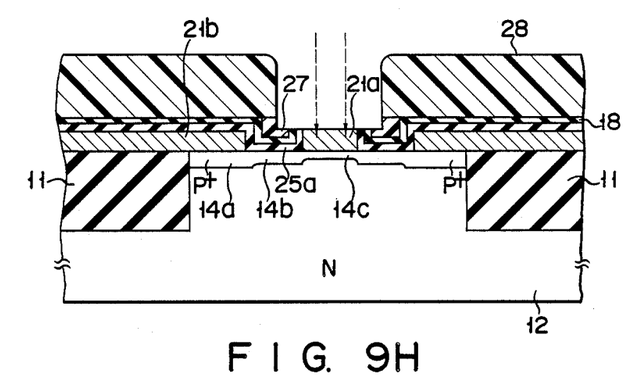

PROCESS 8 (FIG. 9H)

RIE etching process is applied to the portion of Si$_3$N$_4$ layer 18 exposed to opening 28a, the portion of SiO$_2$ layer 25b under the exposed Si$_3$N$_4$ portion, and the portion of resist layer 27 exposed to opening 28 to remove those portions. The etching process is performed at substantially the same rate. In the description of PROCESS 7, incomplete removal of the resist layer on the polysilicon layer suffices. The reason for this is that the residual resist layer can be completely removed by the RIE etching process in this process, i.e., PROCESS 8. In the final step in PROCESS 8, arsenic (As) ion is implanted into polysilicon layer 21a, with resist layer 28 as a mask, under the condition that accelerating electric field is 40 to 60 KeV and dosage is $1 \times 10^{15}$ to $1 \times 10^{16}$ atom/cm$^2$.

Figure 9I:
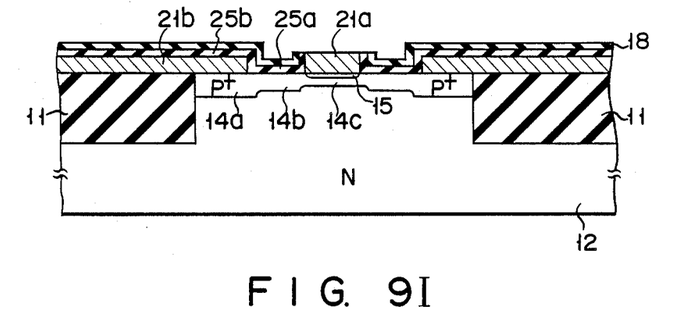

PROCESS 9 (FIG. 9I)

After removal of resist layer 28, the resultant structure is thermally heated at 900° to 1000° C., so that the arsenic (As) ion doped in As-doped polysilicon layer 21a is diffused into the silicon substrate to form emitter region 15. This process may be the diffusion process as described by H. Park et al in their article "High-Speed Self-aligned Polysilicon Emitter/Base Bipolar Devices Using Boron and Arsenic Diffusion Through Polysilicon.; Extended Abstracts of the 18th Conference on Solid State Devices and Materials, Tokyo, 1986, pp 729-731. With this process, third P type region 14c in the base region is approximately 1500 Angstroms in thickness, emitter region 15 is approximately 500 Angstroms in thickness, and the transition frequency f$_T$.

Figure 9J:
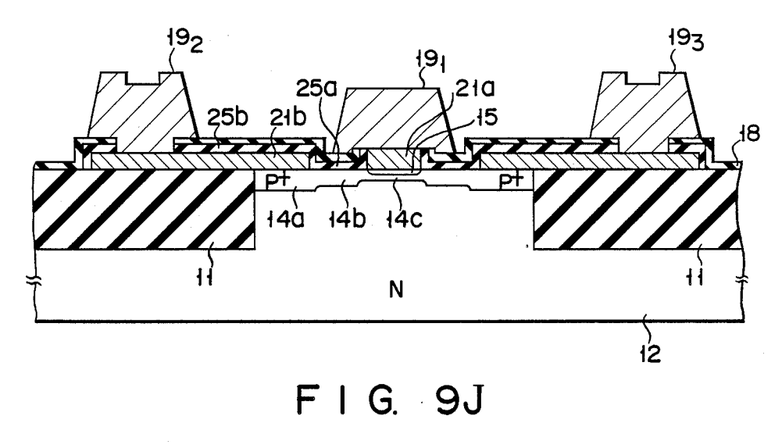

PROCESS 10 (FIG 9J)

An electrode layer made of alluminum is formed on the structure and is patterned to form electrodes 19$_1$, 19$_2$, and 19$_3$.

According to the manufacturing method of the present invention, a p$^+$—P (external) —P$^-$ active base structure can be formed by the self-align method with addition of the masking process for the selective ion implantation. To form the base-emitter structure, one time of the polysilicon formation suffices in the manufacturing process. In the semiconductor device according to this invention, the second P type region is formed in a self-aligning manner between the P$^+$ and N$^+$ regions (emitter). Therefore, no crystal defect due to a contact of high concentration diffusion region—high concentration diffusion region will occur, and a high yield can be realized.

What is claimed is:

1. A method of manufacturing a semiconductor device comprising the steps of:
    forming an insulating layer in a semiconductor substrate, for defining a semiconductor region of a first conductivity type separated from other semiconductor regions;

forming a polysilicon semiconductor layer on said semiconductor substrate:

patterning said polysilicon semiconductor layer to form an emitter leading electrode and a base leading electrode;

implanting a second conductivity type impurity ion into said base leading electrode;

thermally heating the implanted ion to diffuse the ion into said semiconductor region to form a first region of the second condcutivity type;

implanting a second conductivity type impurity ion into said emitter leading electrode and that portion of said semiconductor region on which said emitter leading electrode or said base leading electrode are not formed;

thermally heating the last-recited ion to form a second region of the second conductivity type, which is in contact with and shallower than said first region of the second conductivity type, and at the same time diffusing the second conductivity type impurity from said emitter leading electrode into said semiconductor region, so that a third region of the second conductivity type is formed in said semiconductor region, and which is in contact with and shallower than said second region of the second conductivity type; and implanting a first conductivity type impurity ion into said emitter leading electrode, and thermally heating the implanted ion to form a first conductivity type region constituting an emitter region in said third region of the second conductivity type.

* * * * *